United States Patent
Stephens et al.

(10) Patent No.: US 8,363,411 B2
(45) Date of Patent: Jan. 29, 2013

(54) PASSIVE, LOW-PROFILE HEAT TRANSFERRING SYSTEM

(75) Inventors: Matthew Stephens, Harrogate (GB);
Bhavesh Tailor, Crossflatts (GB);
Stewart Marlow, Bradford (GB);
Robert Legg, Huddersfield (GB)

(73) Assignee: Eldon Technology Limited, Keighley (GB)

(*) Notice: Subject to any disclaimer, the term of this patent is extended or adjusted under 35 U.S.C. 154(b) by 39 days.

(21) Appl. No.: 13/051,930

(22) Filed: Mar. 18, 2011

(65) Prior Publication Data

US 2012/0236506 A1 Sep. 20, 2012

(51) Int. Cl.
*H05K 7/20* (2006.01)

(52) U.S. Cl. ........ 361/719; 361/709; 361/752; 174/548; 312/223.2

(58) Field of Classification Search .................. 361/688, 361/701–722, 751–752, 760
See application file for complete search history.

(56) References Cited

U.S. PATENT DOCUMENTS

| | | | |
|---|---|---|---|
| 5,008,582 A | 4/1991 | Tanuma et al. | |
| 5,296,739 A | 3/1994 | Heilbronner et al. | |
| 5,500,556 A | 3/1996 | Kosugi | |
| 5,673,176 A * | 9/1997 | Penniman et al. | 361/679.54 |
| 5,911,582 A | 6/1999 | Redford et al. | |
| 5,921,757 A | 7/1999 | Tsutsui et al. | |
| 5,965,937 A | 10/1999 | Chiu et al. | |
| 6,025,991 A * | 2/2000 | Saito | 361/704 |
| 6,049,469 A * | 4/2000 | Hood et al. | 361/818 |
| 6,128,194 A | 10/2000 | Francis | |
| 6,212,074 B1 | 4/2001 | Gonsalves et al. | |
| 6,219,236 B1 | 4/2001 | Hirano et al. | |
| 6,577,504 B1 | 6/2003 | Lofland et al. | |
| 6,665,187 B1 | 12/2003 | Alcoe et al. | |
| 6,818,276 B2 | 11/2004 | Bourdelais et al. | |
| 6,946,856 B1 | 9/2005 | Tellkamp | |
| 6,982,877 B2 | 1/2006 | Vinson et al. | |
| 7,236,368 B2 | 6/2007 | Maxwell et al. | |
| 7,248,475 B2 | 7/2007 | Paydar et al. | |
| 7,310,233 B2 | 12/2007 | Bell | |
| 7,312,534 B2 | 12/2007 | delos Santos et al. | |

(Continued)

FOREIGN PATENT DOCUMENTS

| | | |
|---|---|---|
| EP | 0634890 A1 | 1/1995 |
| EP | 1760781 A1 | 8/2006 |

(Continued)

OTHER PUBLICATIONS

PiezoFans, LLC—Piezo Fans and Piezoelectric Technology, "Advanced Micro-Cooling Systems" Product Description, http://piezofans.com/, download date Mar. 4, 2011, 2 pages.

(Continued)

*Primary Examiner* — Courtney Smith
(74) *Attorney, Agent, or Firm* — Lowe Graham Jones PLLC

(57) ABSTRACT

A media content receiving device, such as a set top box, includes a thermally conductive chassis having at least one panel with opposing surfaces. One of the opposing surfaces is exposed to an ambient environment. A circuit board located within the chassis includes at least one integrated circuit chip. A thermally conductive heat transferring unit is bonded to and in thermal conductive contact with the chip. The heat transferring unit is arranged to transfer heat from the chip to the at least one panel of the chassis while minimizing radiant heat transfer proximate the chip. The heat transferring unit may be biased toward the panel.

19 Claims, 3 Drawing Sheets

U.S. PATENT DOCUMENTS

| | | | |
|---|---|---|---|
| 7,345,885 B2 | 3/2008 | Bourdreaux et al. | |
| 7,550,825 B2 | 6/2009 | Santos et al. | |
| 7,629,400 B2 | 12/2009 | Hyman | |
| 7,742,299 B2 | 6/2010 | Sauciuc et al. | |
| 2004/0032710 A1* | 2/2004 | Fujiwara et al. | 361/685 |
| 2005/0008832 A1 | 1/2005 | Santos et al. | |
| 2005/0036292 A1* | 2/2005 | Chengalva et al. | 361/715 |
| 2005/0111195 A1* | 5/2005 | Wu | 361/705 |
| 2005/0266295 A1 | 12/2005 | Takai | |
| 2006/0198108 A1* | 9/2006 | Refai-Ahmed et al. | 361/719 |
| 2007/0215907 A1 | 9/2007 | Krimmer et al. | |
| 2007/0278683 A1 | 12/2007 | Santos et al. | |
| 2008/0135216 A1 | 6/2008 | Zhang et al. | |
| 2008/0277780 A1 | 11/2008 | Hayakawa | |
| 2010/0111666 A1 | 5/2010 | Guitton et al. | |
| 2010/0261386 A1 | 10/2010 | Blum et al. | |
| 2010/0290183 A1 | 11/2010 | Rijken et al. | |
| 2011/0063801 A1* | 3/2011 | Lin et al. | 361/705 |
| 2012/0050988 A1* | 3/2012 | Rothkopf et al. | 361/688 |

FOREIGN PATENT DOCUMENTS

| | | |
|---|---|---|
| EP | 1991042 A2 | 5/2009 |
| EP | 2138922 A1 | 12/2009 |
| JP | 2003249780 A | 9/2003 |
| WO | 03/107427 | 12/2003 |
| WO | 2006101346 A1 | 9/2006 |
| WO | 2009/058149 | 5/2009 |
| WO | 2009096966 A1 | 8/2009 |
| WO | 2011146302 A1 | 11/2011 |

OTHER PUBLICATIONS

Burton et al., David Robert, "Media Content Device Chassis with Internal Extension Members," U.S. Appl. No. 13/052,685, filed Mar. 21, 2011.

Burton et al., David Robert, "Media Device Having a Piezoelectric Fan," U.S. Appl. No. 13/074,964, filed Mar. 29, 2011.

Burton et al., David Robert, "Media Content Device with Customized Panel," U.S. Appl. No. 13/074,971, filed Mar. 29, 2011.

Hardaker et al., Trevor, "Apparatus, Systems and Methods for Detecting Infrared Signals at a Media Device Configured to be Positioned in Different Orientations," U.S. Appl. No. 13/036,943, filed Feb. 28, 2011.

Burton et al., David Robert, "Apparatus, Systems and Methods for Power Line Carrier Data Communication to DC Powered Electronic Device," U.S. Appl. No. 13/074,736, filed Mar. 29, 2011.

Burton et al., David Robert, "Apparatus, Systems and Methods for Securely Storing Media Content Events on a Flash Memory Device," U.S. Appl. No. 13/053,492, filed Mar. 22, 2011.

Burton et al., David Robert, "Apparatus, Systems and Methods for Control of Inappropriate Media Content Events," U.S. Appl. No. 13/053,487, filed Mar. 22, 2011.

* cited by examiner

PASSIVE, LOW-PROFILE HEAT TRANSFERRING SYSTEM

BACKGROUND

Media content receiving devices, which may take the form of a set top box (STB), is configured to deliver one or more selected programs to a media presentation device coupled to or within the STB. Typically, the STB connects to a television and an external signal source in which the signal (e.g., cable signal) is converted into media content displayable on the television. However, the STB may operate with other types of media presentation devices, the latter taking the form of, but not limited to, televisions (TVs), personal computers (PCs), stereos, personal digital assistants (PDAs), surround-sound systems, and digital video recorders (DVRs). Particular programs may be selected by a user who provides program selection instructions to the STB. The selected program may then be presented to the user. For example, if the selected program is a movie, the video portion of the movie is displayed on a display of the TV, the PC, or the like. The audio portion of the movie may concurrently be presented over the speakers of the TV, the stereo, or the surround-sound system. In some instances, the selected program may be stored into a DVR or other recording device for later retrieval and presentation. The DVR may be an integrated component of the STB, or the DVR may be a stand-alone device that is communicatively coupled to the STB.

For a variety of reasons such as consumer demand, portability, spatial constraints and aesthetics, the tendency in the marketplace has been toward more streamlined components still capable of providing a high quality media content (e.g., flat screen televisions and small, wall mounted speakers).

However, one of the continual challenges of making a low profile, streamlined media content streaming device, such as the STB, is the effective transfer of heat away from a die being cooled provided on a chip of a printed circuit board (PCB). Conventional set boxes typically effectuate such heat transfer with an active cooling system that typically employs one or more fans or blowers to move air through the STB. One drawback of a conventional fan system is the amount of spatial envelope needed within the STB to mount and adequately operate the fan.

SUMMARY

In accordance with an aspect of the present invention, a media content receiving device includes a thermally conductive chassis having at least one panel with opposing surfaces. One of the opposing surfaces is exposed to an ambient environment. A circuit board located within the chassis includes at least one integrated circuit chip. A thermally conductive heat transferring unit is bonded to and in thermal conductive contact with the chassis. The heat transferring unit is arranged to transfer heat from the chip to at least one panel of the chassis while minimizing radiant heat build-up proximate the chip.

In accordance with another aspect of the present invention, a chassis for a set top box includes a top panel having a top panel thickness, an interior surface, and an exterior surface exposed to an ambient environment. A periphery region of the chassis has a thickness that is greater than the top panel thickness. The chassis includes a heat spreader located within the chassis and in thermal contact with the chassis. In one embodiment, the top panel operates as a heat transfer conduit to allow heat to be drawn into the periphery region, which in turn operates as a heat sink to dissipate at least some of the heat to the ambient environment.

In accordance with yet another aspect of the present invention, a method for transferring heat out of a media content receiving device includes conductively transferring heat from an integrated circuit chip into a heat spreader located proximate the chip; conductively transferring heat from the heat spreader to a chassis panel of the media content receiving device in which the heat spreader is in thermal contact with the chassis; and transferring heat from the panel to an ambient environment.

BRIEF DESCRIPTION OF THE DRAWINGS

In the drawings, identical reference numbers identify similar elements or acts. The sizes and relative positions of elements in the drawings may not be necessarily drawn to scale. For example, the shapes of various elements, thicknesses and angles may not be drawn to scale, and some of these elements may be arbitrarily enlarged or positioned to improve drawing legibility. Preferred and alternative embodiments are described in detail below with reference to the following drawings.

DETAILED DESCRIPTION

Figure 1:
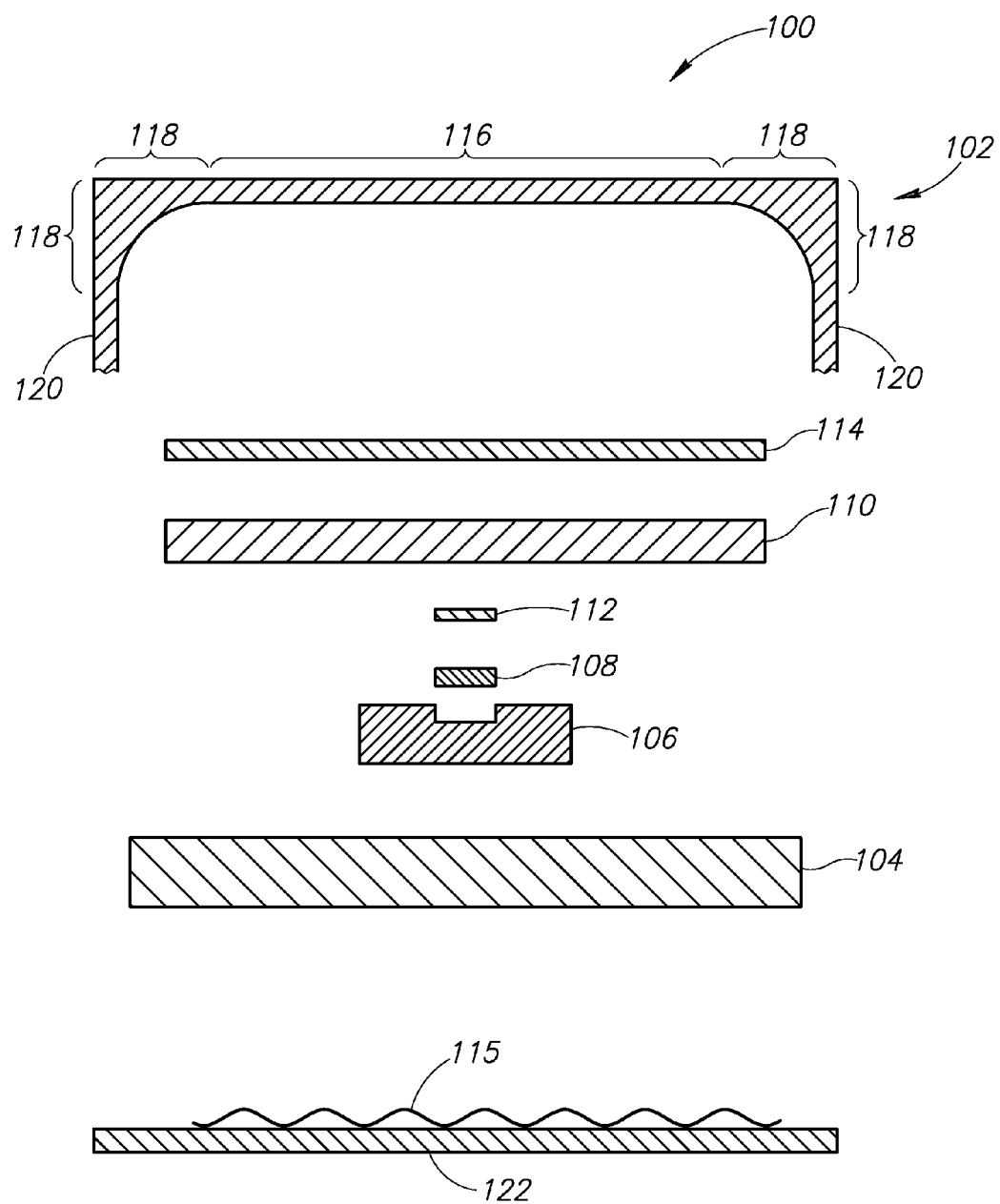
FIG. 1 is an exploded, cross-sectional, schematic view of a set top box having a heat transferring unit arranged to thermally conduct heat to a chassis in accordance with one embodiment.

FIG. 1 is a schematic, cross-sectional view of a media content receiving device 100, otherwise referred to as a set top box (STB), having a low-profile chassis 102. Arranged within the chassis 102 is a circuit board 104, an integrated circuit chip 106, a die 108, and a heat transferring unit 110, which provides a thermally conductive path from the die being cooled 108 to the chassis 102, thus the heat transferring unit 110 thermally connects to the chassis 102, which in turn operates as a heat sink. The conductive path may include one or more additional layers, such as, but not limited to a thermal interface layer 112 and a gap filling layer 114, where one or both layers may provide a means to account for physical, dimensional tolerance adjustments within the set top box and/or provide bonding means between the respective components. The chassis 102 includes a top panel 116, a rim or periphery region 118, side panels 120, and a bottom panel 122. Preferably, at least the top panel 116 and rim 118 are made from thermally conductive materials, which may be different. In one embodiment, the heat transferring unit 110 providing a conductive heat path that draws heat energy from the die being cooled 108 and into the top panel 116 of the chassis 102. While some of the heat energy may dissipate from the top panel 116 to ambient, a portion of the heat energy will also move through the top panel 116 into a thicker rim 118 of the chassis 102.

The term "low-profile" as used herein broadly refers to an external spatial envelop taken up by the assembled set top box 100. By way of example, the low-profile chassis 102 may have a height of about 8.0 mm to about 25.4 mm. In use, the low-profile chassis 102 may be spatially oriented in a variety of ways, such a vertically behind a wall mounted television or horizontally on a shelf or media cabinet. Thus, the directional references used herein are for interpretation of the drawings and are not meant to limit the scope of the invention. For example, directing heat upward toward the top panel 116 should be broadly interpreted as directing heat in any direction toward a selected panel of the chassis 102.

Within the chassis 102, the circuit board 104 comprises a printed circuit board (PCB), having one or more chips 106 arranged thereon, and in which at least one of the chips 106 includes the die being cooled 108. The heat transferring unit 110 is arranged on the chip 106 and is thermally coupled to the die being cooled 108.

In the illustrated embodiment, the heat transferring unit 110 comprises a flat sheet metal component preferably made from an aluminum alloy for manufacturing and cost purposes. The heat transferring unit 110 is thermally coupled to the chip 106 and to the die being cooled 108 using the thermal interface layer 112, which is described in greater detail below. In one embodiment, the heat transferring unit 110 has approximately a uniform thickness of about 3.0 mm. A lower surface of the heat transferring unit 110 is preferably a polished surface to minimize emissivity hence heat energy from radiating towards the substrate of chip 106 and other components mounted on the PCB 104. The heat transferring unit 110 may have other thicknesses and take a variety of shapes depending on the configuration of the chassis 102 and/or the chip 106. The heat transferring unit 110 is configured and arranged on the chip 106 and within the chassis 102 as to most efficiently conduct heat from the die being cooled 108 upward toward the top panel 116 of the chassis 102 while also minimizing radiant heat transfer in a vicinity of the chip 106.

In the illustrated embodiment, the heat transferring unit 110 is bonded to the chip 106 using a thin layer of the thermal interface layer 112, which may take the form of, but is not limited to, a phase change material. Preferably, the thermal interface layer 112 exhibits a sufficient level of heat conduction (i.e., conductive heat transfer) performance and may have a thickness that can achieve a suitable bond even when using low pressure at the time of mounting. The thermal interface layer 112 may be comprised of a thermally conductive compound such as a polymer solder hybrid (PSH).

Optionally, a gap filler material 114 may be applied onto a surface of the heat transferring unit 110 to take up any assembly tolerances of the components in the aggregate, and more specifically to take up any manufacturing tolerances between the heat transferring unit 110 and the chassis 102. The gap filler material 114 may take the form of a thermally conductive, electrically insulating, filler tape having a natural tack on at least one side to allow for stick-in-place characteristics during application assembly. The gap filler material 114 may include a pliable, elastic polymer material (e.g., a compressible material) that may sufficiently flow onto even rough surfaces using low pressure application techniques.

Either in addition to, or alternative to, the gap filler material 114, the circuit board 104 may be biased using a biasing device 115 located beneath the circuit board 104. The biasing device 115 may take the form of one or more compression springs, which in turn may include, but are not be limited to, helical springs, Belleville springs, cantilever or simple beam springs, sinusoidal-shaped or wave springs (as illustrated), and volute springs. Biasing the circuit board 104 in such a manner urges the heat transferring unit 110 into a more efficient thermal contact with the chassis 102.

The configuration of the chassis 102 may take a variety of forms, but preferably is configured to enhance the heat transfer to the ambient environment. In the illustrated embodiment, the chassis 102 includes the top panel 116, the rim or periphery region 118, side panels 120, and the bottom panel 122.

Figure 2:
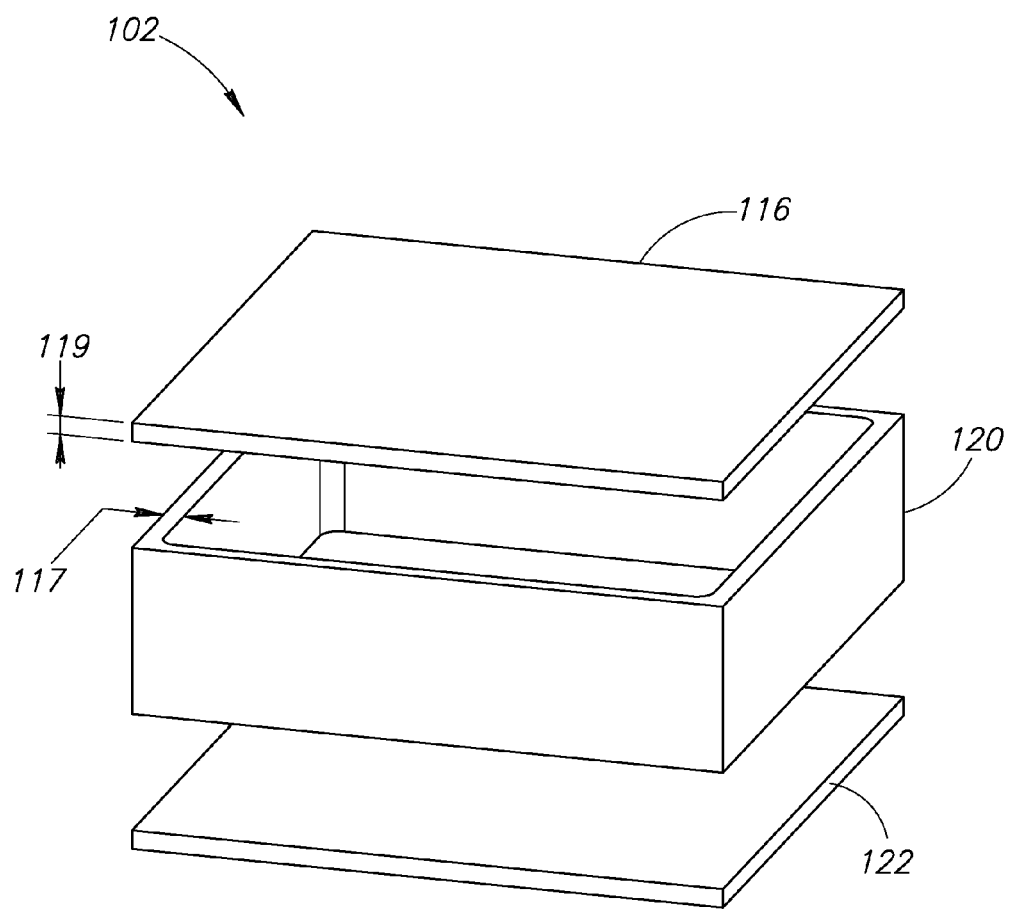
FIG. 2 is an exploded, perspective view of a chassis of a set top box in accordance with one embodiment.

FIG. 2 shows the chassis 102 as a three piece assembly comprising the top panel 116, the bottom panel 122 and the continuously-formed side panels 120, the latter integrally including the periphery regions 118. In the illustrated embodiment, a side panel thickness 117 is greater than a top panel thickness 119. Alternatively, the chassis 102 may be a single piece, molded or machined, may be two pieces (e.g., top panel coupled to the bottom/sides), or some other multi-piece configuration.

Although the top panel 116 is relatively thinner than the periphery region 118, some heat is conducted through top panel 116 to make use of the periphery region 118 to assist dissipation. The thicker periphery region 118, in turn, further increases heat conduction to the sides 120. Thus, the chassis 102 with the thinner top panel 116 and thicker periphery region 118 operates to rapidly and efficiently pull heat from the heat transferring unit 110 out to the external environment. The chassis 102 may be made from any type of thermally conductive material, but preferably would be made from an aluminum alloy for strength, durability, manufacturing ease and lower cost.

Figure 3:
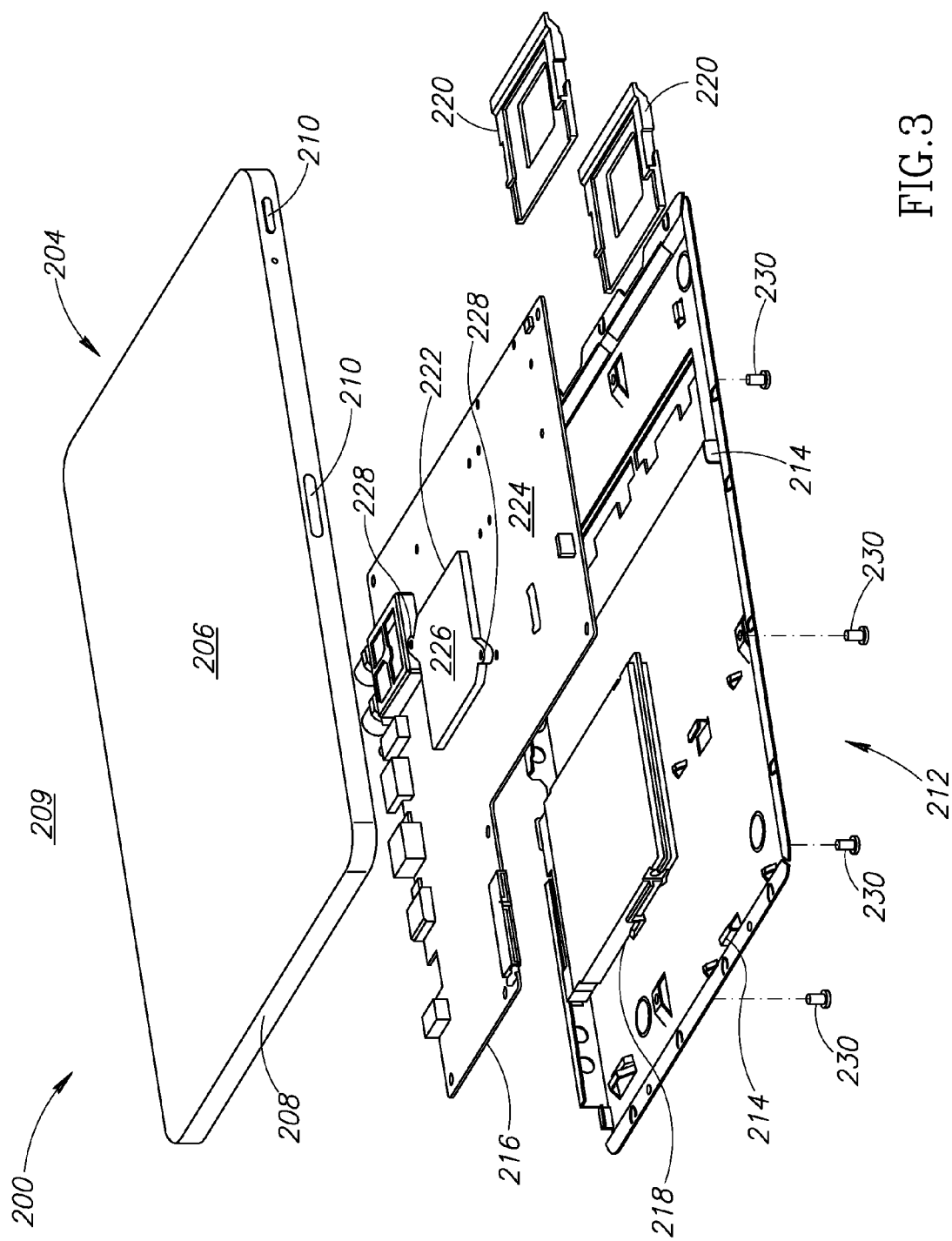
FIG. 3 is an exploded, perspective view of a set top box having a heat spreader arranged on a circuit board in accordance with one embodiment.

FIG. 3 shows an alternate embodiment of a set top box 200 having a two-part chassis 202. An upper cover 204 of the chassis takes the form of an integral, die-cast cover having a top panel 206 and side panels 208. Exterior surfaces of the top panel 206 and side panels 208 are exposed to an ambient environment 209. One or more light-pipes 210 may be located in one of the side panels 208. The light-pipes 210 may include an infrared light-pipe, a standby light-pipe, or some other type. A lower cover 212 may take the form of a stamped sheet having connectors 214 for engaging a printed circuit board (PCB) 216. A hard disk drive (HDD) 218 and one or more card guides 220 may be coupled to or supported on the lower cover 212.

A heat transferring unit 222, also referred to herein as a heat spreader 222, is attached to the PCB 216 over a desired region, preferably over a die being cooled as discussed in the aforementioned embodiment. Further, a thermal gap filler material (not shown) may be supported on an upper surface 226 of the heat spreader 222. In the illustrated embodiment, the heat spreader 222 includes extensions 228 configured to receive pins, posts, dowels, or fasteners to secure the heat spreader 222 to the PCB 216. The upper cover 204 and lower cover 212 may be coupled together with fasteners 230.

The low profile of the heat transferring unit or heat spreader and its location between the chip and one of the panels of the chassis advantageously permits the overall thickness of the set top box to be reduced while eliminating the need for active cooling mechanisms, such as fans or blowers. Thus, the low profile permits the thinner set top box to be placed into places with a smaller spatial envelope, for example behind a flat screen television. This passive cooling configuration may also provide for a longer operational life of the set top box.

It should be emphasized that the above-described embodiments are merely possible examples of implementations of the invention. Many variations and modifications may be made to the above-described embodiments. All such modifications and variations are intended to be included herein within the scope of this disclosure and protected by the following claims.

The invention claimed is:
1. A system comprising:
 a thermally conductive chassis having at least one panel with a first opposing surface and a second opposing surface, and wherein the first opposing surface is external to the thermally conductive chassis and is exposed to an ambient environment, and wherein the second opposing surface is internal to the thermally conductive chassis;

a circuit board located within the chassis, the circuit board having at least one integrated circuit chip;

a thermal interface material disposed between the at least one integrated circuit chip and the thermally conductive chassis, wherein a first side of the thermal interface material is in thermally conductive contact with the at least one integrated circuit chip, and wherein the thermal interface material is a polymer solder hybrid;

a thermally conductive heat transferring unit disposed between the thermal interface material and the thermally conductive chassis, and wherein a first side of the thermally conductive heat transferring unit is in thermally conductive contact with an opposing second side of the thermal interface material;

a gap filler material located between the heat transferring unit and a top panel of the chassis, wherein the gap filler material is in adhesive contact with a second opposing surface of the top panel, wherein the gap filler material is different from the thermal interface material and wherein the filler material is in thermally conductive contact with the second side of the thermal interface material, and wherein the thermally conductive heat transferring unit is arranged to transfer heat from the at least one integrated circuit chip to the at least one panel of the chassis while minimizing radiant heat build-up proximate the at least one integrated circuit chip.

2. The system of claim 1, wherein the chassis includes a periphery region having a thickness that is greater than a top panel thickness.

3. The system of claim 1, further comprising:
a biasing member located between the circuit board and a bottom panel of the chassis, the biasing member configured to urge the thermally conductive heat transferring unit into thermally conductive contact with a top panel of the chassis.

4. The system of claim 1, further comprising:
a die being cooled arranged in the at least one integrated circuit chip and wherein the heat transferring unit is also in thermally conductive contact with the die being cooled.

5. A chassis for a set top box comprising:
a top panel defined by a top panel thickness, an interior surface, and an exterior surface exposed to an ambient environment;
a periphery region of the chassis adjacent to a periphery of the top panel and having a periphery region thickness that is greater than the top panel thickness; and
a heat spreader disposed between the interior surface of the chassis and at least one integrated circuit chip,
wherein the heat spreader is defined by a first surface facing the interior surface of the chassis,
wherein the heat spreader is defined by a second surface opposing the first surface and facing the at least one integrated circuit chip,
wherein at least a portion of the second surface of the heat spreader is polished to minimize radiant heat transfer from the heat spreader towards the at least one integrated circuit chip,
wherein the heat spreader is in thermal contact with the chassis and the at least one integrated circuit chip,
wherein the heat spreader thermally conducts heat generated by the at least one integrated circuit chip into at least one of the top panel or periphery region for dissipation to the ambient environment.

6. The chassis of claim 5, further comprising a gap filling, physically compressible thermally conductive material located between the heat spreader and the top panel, wherein the compressible material is thermally conductive.

7. The chassis of claim 5, further comprising:
a plurality of side panels,
wherein the periphery region extends from the top panel into an edge of each of the plurality of adjacent side panels of the chassis,
wherein the top panel, the periphery region, and the plurality of side panels are formed as an integral, die cast chassis body, and
wherein the greater thickness of the periphery region pulls heat from the top panel.

8. A method for transferring heat out of a media content receiving device, the method comprising:
conductively transferring heat from an integrated circuit chip into a thermal interface material that is in thermally conductive contact with the integrated circuit chip, wherein the thermal interface material is a first material that is a phase change material;
conductively transferring the heat from the thermal interface material into a heat spreader that is in thermally conductive contact with the thermal interface material and that is located proximate the integrated circuit chip;
conductively transferring the heat from the heat spreader to a gap filler material, wherein the gap filler material is a material different from the thermal interface material, and wherein the gap filler material is defined by a first surface and an opposing second surface in thermally conductive contact with the heat spreader,
conductively transferring the heat from the gap filler material to a chassis panel of the media content receiving device, wherein the chassis panel is in thermally conductive contact with the gap filler material, and wherein the first surface of the gap filler material is adhesively affixed to an internal surface of the chassis panel; and
transferring the heat from the chassis panel to an ambient environment.

9. The method of claim 8, wherein conductively transferring the heat from the integrated circuit chip into the heat spreader comprises transferring the heat from a die being cooled arranged on the at least one integrated circuit chip.

10. The method of claim 8, further comprising:
biasing the heat spreader toward the chassis panel.

11. The method of claim 8, wherein conductively transferring the heat from the gap filler material to the chassis panel comprises transferring the heat to a top panel of the chassis.

12. The system of claim 1, wherein the first side of the thermally conductive heat transferring unit has at least a first side portion and a second side portion, wherein the first side portion of the thermally conductive heat transferring unit is in adhesive contact with the opposing second side of the thermal interface material, wherein at least the second side portion of the thermally conductive heat transferring unit is polished so as to minimize radiant heat emission from the thermally conductive heat transferring unit proximate to the at least one integrated circuit chip.

13. The system of claim 1, wherein the polished second side portion of the thermally conductive heat transferring unit is not in adhesive contact with the opposing second side of the thermal interface material and is not in contact with the at least one integrated circuit chip.

14. The chassis of claim 5, wherein the first surface of the heat spreader is in thermal contact with the chassis via an intervening gap filler material that is a thermally conductive, electrically insulating tape having on at least one side an adhesive tack to adhesively affix the thermal interface material to the interior surface of the top panel, wherein the second surface of the heat spreader is in thermal contact with at least one integrated circuit chip disposed on a circuit board that is inside the chassis via an intervening gap filler material that is a polymer solder hybrid, and wherein the heat spreader thermally conducts heat generated by the at least one integrated circuit chip into at least one of the top panel or periphery region for dissipation to the ambient environment.

15. The chassis of claim 5, wherein the polished portion of the second side of the thermally conductive heat transferring unit is not in adhesive contact with the opposing second side of the thermal interface material.

16. The chassis of claim 5, wherein the polished portion of the second side of the thermally conductive heat transferring unit is not in contact with the at least one integrated circuit chip.

17. The method of claim 8, wherein the phase change material of the thermal interface material is a polymer solder hybrid.

18. The method of claim 8, wherein the heat spreader is defined by a first side and an opposing second side, wherein the second side of the heat spreader is in contact with the gap filler material, wherein a first portion of the first side of the thermally conductive heat transferring unit is in contact with the thermal interface material, wherein at least a second portion of the first side of the thermally conductive heat transferring unit is polished to minimize radiant heat build-up from the thermally conductive heat transferring unit proximate to the at least one integrated circuit chip.

19. The method of claim 8, wherein the polished portion of the first side of the thermally conductive heat transferring unit is not in contact with the at least one integrated circuit chip.

* * * * *

UNITED STATES PATENT AND TRADEMARK OFFICE
CERTIFICATE OF CORRECTION

PATENT NO. : 8,363,411 B2  
APPLICATION NO. : 13/051930  
DATED : January 29, 2013  
INVENTOR(S) : Stephens et al.

Page 1 of 1

It is certified that error appears in the above-identified patent and that said Letters Patent is hereby corrected as shown below:

In Column 5, Line 23, prior to the word "filler" please insert the word --gap--

Signed and Sealed this
Second Day of April, 2013

Teresa Stanek Rea
*Acting Director of the United States Patent and Trademark Office*